United States Patent [19]

Anderson

[11] 4,047,126
[45] Sept. 6, 1977

[54] SOLID STATE KLYSTRON

[75] Inventor: Gary L. Anderson, Ventura, Calif.

[73] Assignee: The United States of America as represented by the Secretary of the Navy, Washington, D.C.

[21] Appl. No.: 706,705

[22] Filed: July 19, 1976

[51] Int. Cl.² .................. H03B 5/18; H03B 7/14; H03B 9/12

[52] U.S. Cl. .................. 331/96; 331/107 R; 331/107 G; 331/117 D; 331/177 V; 331/185

[58] Field of Search .......... 331/96, 107 R, 107 G, 331/117 D, 177 V, 185, 186; 328/262, 263; 307/296, 297

[56] References Cited

U.S. PATENT DOCUMENTS

| 3,339,152 | 8/1967 | Will | 331/96 |
|---|---|---|---|
| 3,576,503 | 4/1971 | Hanson | 331/96 |
| 3,735,286 | 5/1973 | Vane | 331/107 G X |
| 3,848,201 | 11/1974 | Presser | 331/117 D X |

OTHER PUBLICATIONS

Bass et al., "Major Role for GaAs Devices in Microwave Communications," Electronic Engineering, Nov. 1970, vol. 42, pp. 61–65.

Draper, "Recent Developments in Solid State Sources for Microwave Instrumentation," Electronic Engineering, Jan. 1974, pp. 54–56, 58.

Primary Examiner—Siegfried H. Grimm
Attorney, Agent, or Firm—Richard S. Sciascia; Joseph M. St.Amand; Darrell E. Hollis

[57] ABSTRACT

A solid state klystron comprising a switching regulator, power source, tuning adapter, and solid state oscillator utilizing supply voltages identical to those of a standard tube-type klystron.

34 Claims, 15 Drawing Figures

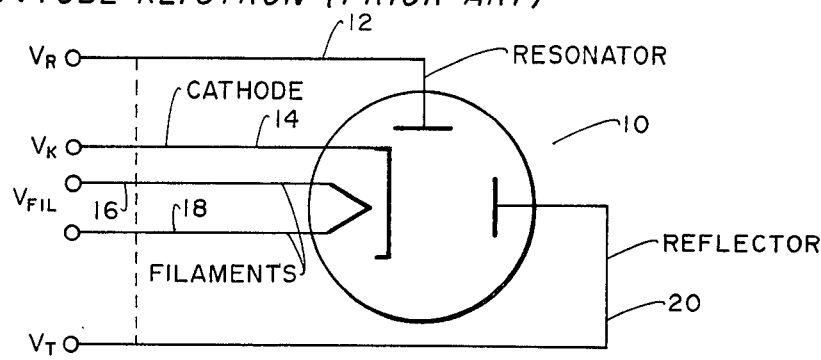
Fig. 1. TUBE KLYSTRON (PRIOR ART)
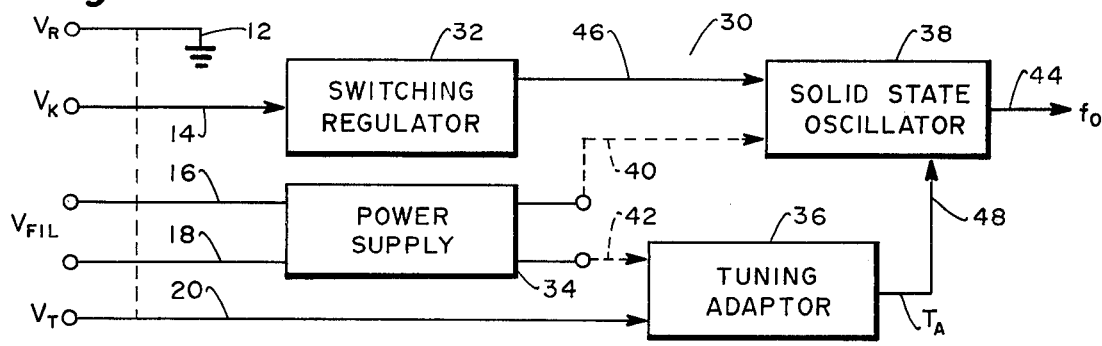
Fig. 2. SOLID STATE KLYSTRON
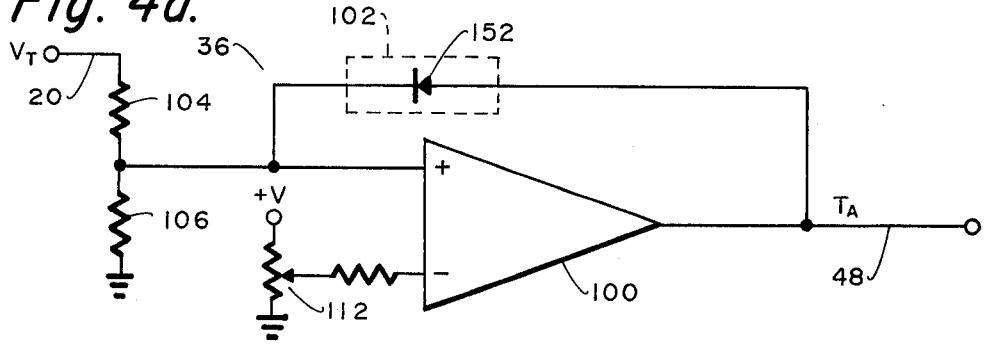
Fig. 4a.
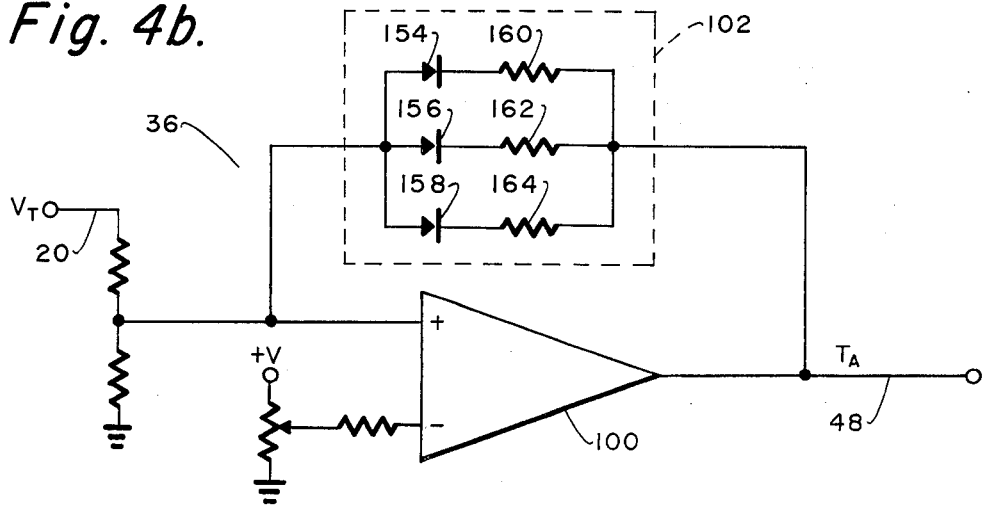
Fig. 4b.

SOLID STATE KLYSTRON

BACKGROUND OF THE INVENTION

1. Field of the Invention

This invention relates generally to solid state klystrons and more particularly to such solid state klystrons as are capable of utilizing the supply voltage of a tube-type klystron.

2. Description of the Prior Art

There is a wide range of uses for klystrons at microwave frequencies. These include applications as local oscillators and source tubes, among others. All known prior art klystrons are of the tube type. Tube-type klystrons are expensive and have low reliability. In addition, the output power of tube-type klystrons are dependent upon the reflector voltage. Also, in the tube-type klystron, the output power and frequency is extremely sensitive to slight variations in input voltage.

SUMMARY OF THE INVENTION

To overcome the above disadvantages, the present invention provides a solid state klystron comprising a switching regulator, a solid state oscillator, and a tuning adapter.

Accordingly, one object of the present invention is to increase reliability.

Another object of the present invention is to reduce cost.

A further object of the present invention is to increase stability.

A still further object of the present invention is to increase resistance to shocks and vibrations.

Another further object of the present invention is to increase capability for reproduction of characteristics.

Other objects and a more complete appreciation of the present invention and its many attendant advantages will develop as the same becomes better understood by reference to the following detailed description when considered in connection with the accompanying drawings in which like reference numerals designate like parts throughout the figures thereof and wherein.

BRIEF DESCRIPTION OF THE DRAWINGS

FIG. 1 is a schematic diagram of a prior art tube-type klystron.

FIG. 2 is a block diagram of one embodiment of the present invention.

FIGS. 4a and 4b are schematic diagrams illustrating alternative tuning adapters for the embodiment illustrated in FIG. 2.

DETAILED DESCRIPTION OF THE PREFERRED EMBODIMENT

Figure 3:
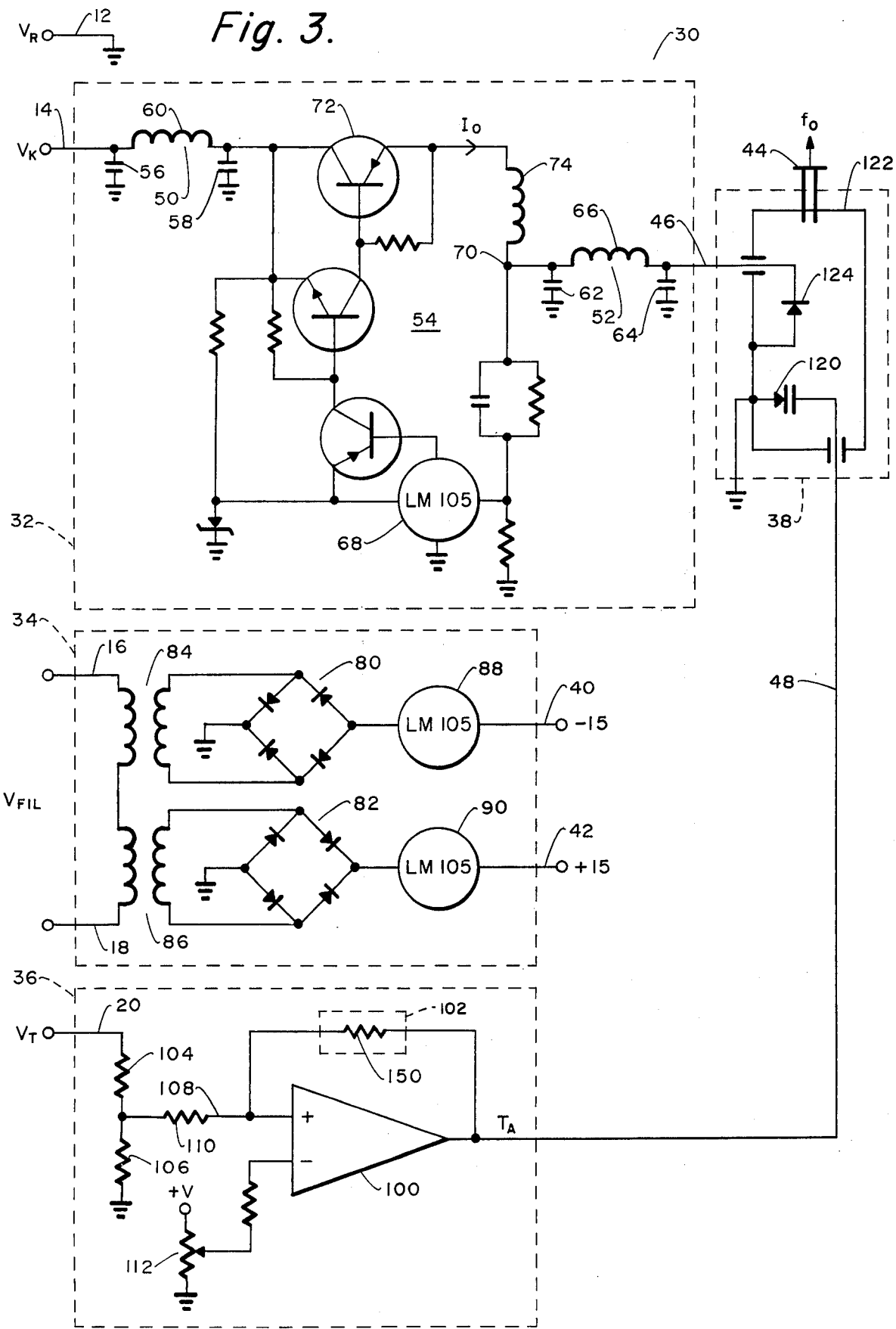
FIG. 3 is a schematic diagram illustrating the embodiment of FIG. 2.

Turning to FIG. 1, there is illustrated a prior art tube klystron 10. $V_R$, the resonator voltage, inputs klystron 10 via line 12. $V_K$, the cathode voltage, inputs klystron 10 via line 14. $V_{FIL}$, the filament voltage, inputs klystron 10 via lines 16 and 18. Reflector voltage, $V_T$, inputs klystron 10 via line 20. It is noted that the resonator voltage $V_R$, the cathode voltage $V_K$, and the reflector voltage $V_T$ are D.C. voltages while the filament voltage $V_{FIL}$ is an A.C. voltage or D.C. voltage.

Now turning to FIG. 2, a solid state klystron 30 is illustrated utilizing the identical supply voltages as klystron 10 of FIG. 1. The supply voltages to the tube klystron 10, $V_R$, $V_K$, $V_{FIL}$, and $V_T$ input solid state klystron 30 on lines 12, 14, 16, 18, and 20, respectively. $V_R$, the resonator voltage, entering solid state klystron 30 on line 12, is grounded. The cathode voltage, $V_K$, entering solid state klystron 30 on line 14, inputs switching regulator 32. The filament voltage, $V_{FIL}$, entering solid state klystron 30 on lines 16 and 18, input power supply 34. The reflector voltage, $V_T$, entering solid state klystron 30 on line 20, inputs tuning adapter 36.

Power supply 34 supplies D.C. bias voltages to solid state oscillator 38 via line 40 and to tuning adapter 36 via line 42. Lines 40 and 42 are shown as dotted lines to indicate that other alternative sources of D.C. bias may be utilized.

Switching regulator 32 is a highly efficient inductor capacitor storage-type switching regulator which converts the high voltage of the klystron beam supply or cathode voltage, $V_K$, to the generally lower voltages required for the main supply to solid state oscillator 38.

Tuning voltage adapter 36 translates the normal klystron reflector voltage used for tuning into a voltage compatible with the tuning characteristics of solid state oscillator 38. Operationally, solid state oscillator 38 outputs an A.C. output signal of variable frequency, $f_0$, on line 44 controlled by the input tuning voltage or reflector voltage, $V_T$, on line 20, and whatever tuning characteristics are built into solid state oscillator 38. The output of switching regulator 32 inputs solid state oscillator 38 via line 46 while the output of tuning adapter 36 inputs solid state oscillator 38 via line 48.

FIG. 3 is a schematic diagram illustrating solid state klystron 30 of FIG. 2. Switching regulator 32 comprises an input filter 50, an output filter 52, and a swtiching regulator circuit 54. Input filter 50 consists of a pair of shunt capacitors 56 and 58 with a series inductance 60. Output filter circuit 52 consists of a pair of shunt capacitors 62 and 64 and a series inductance 66. Switching regulator circuit 54 is a standard switching regulator circuit utilizing a National Semiconductor LM 105 integrated voltage regulator as a control element. Such switching regulator circuits are well known to those having average skill in the art. The National Semiconductor Application Handbook contains a vast number of switching regulator circuits which are easily adaptable for use as switching regulator circuit 54 in FIG. 3. Operationally, integrated voltage regulator 68 senses the voltage at point 70 and switches transistor 72 on or off very rapidly to maintain a constant current $I_O$ through inductance 74. The constant current $I_O$ through inductance 74 translates into a constant voltage appearing on line 46 to solid state oscillator 38.

Power supply 34 comprises a pair of fullwave rectifiers 80 and 82. The filament voltage, $V_{FIL}$, is inductably coupled to fullwave rectifiers 80 and 82 through inductor pairs 84 and 86. Fullwave rectifier 80 outputs a negative DC voltage to integrated voltage regulator 88 while fullwave rectifier 82 outputs a positive DC voltage to integrated voltage regulator 90. A negative DC voltage appears on line 40 from integrated voltage regulator 88 while a positive DC voltage appears on line 42 from integrated voltage regulator 90.

Tuning adapter 36 comprises operational amplifier 100 with a feedback path through feedback element 102 to the noninverting input of operational amplifier 100. Feedback element 102 is a resistor 150 in FIG. 3. The reflector voltage $V_T$, inputing tuning adapter 36 on line 20 passes through a voltage divider consisting of resistors 104 and 106. The divided reflector voltage then inputs the non-inverting input of operational amplifier 100 via line 108 after passing through resistor 110. The potentiometer 112 controls the DC level of the signal $T_A$ on line 48. The voltage $T_A$ inputs solid state oscillator 38 via line 48. Line 48 is coupled to a tuning element 120, which in FIG. 3 is a varactor.

Figure 5A:
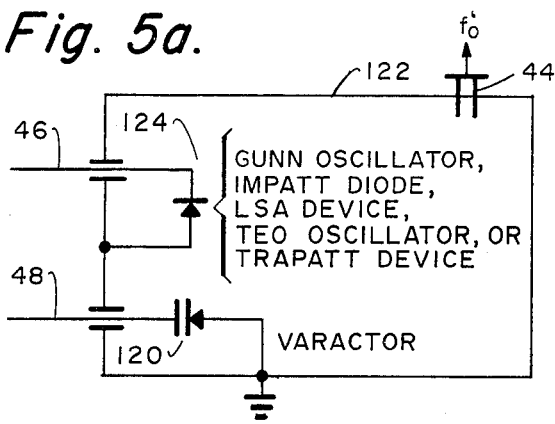
FIGS. 5a through 5f are schematic diagrams illustrating alternative solid state oscillator circuits of the embodiment shown in FIG. 2.

Solid state oscillator 38 is comprised of a cavity 122 containing a tuning element 120 and an oscillating element 124. As shown in FIG. 3 and FIG. 5a, oscillating element 124 may be a Gunn oscillator, an IMPATT diode, an LSA device, a TEO oscillator or a TRAPATT device. The cavity 122 is at ground potential as schematically designated in FIG. 3. The DC signal on line 46 from switching regulator 32 is coupled to the oscillating element 124 through cavity 122. The output signal for cavity 122 and solid state klystron 30 appears on line 44. Thus, the DC voltage appearing on line 46 from switching regulator 32 drives oscillating element 124 while the DC voltage $T_A$ on line 48 from tuning adapter 36 drives tuning element 120. While the oscillating element 124 provides oscillations, the tuning element 120 determines the frequency of the oscillations generated by the oscillating element 124.

Figure 7A:
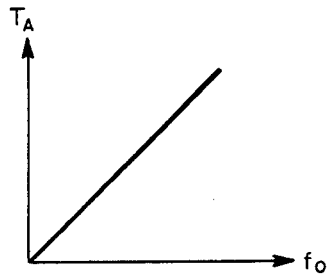
FIGS. 7a, 7b, and 7c illustrate the compensation for non-linearity.
Figure 7B:
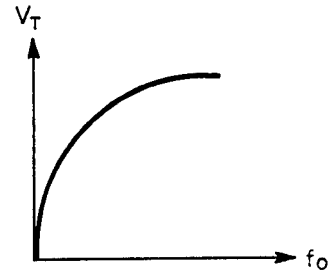
Figure 7C:
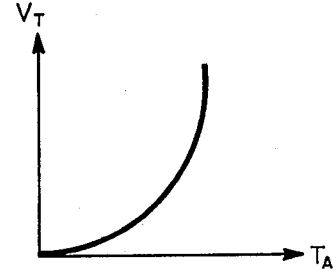

Now turning to FIGS. 7a through 7c, a series of three graphs illustrate some relationships between the output signal $f_0$ on line 44, the DC signal $T_A$ from tuning adapter 36 on line 48, and the DC reflector signal $V_T$ inputing tuning adapter 36 on line 20. The feedback element 102 in FIG. 3 is a linear resistor 150 because within the desired operating range of klystron 30 the frequency of oscillation of the output signal on line 44 changes linearly with changes in the reflector voltage $V_T$ on line 20. That is, the varactor 120 is operating in a linear region. However, this is not always the case as can be seen from the graphs of FIGS. 7a through 7c. FIG. 7a shows the desired linear relationship between the voltage $T_A$ on line 48 and the frequency of oscillations of the output signal appearing on line 44. However, as noted in FIG. 7b, the variance of the frequency of oscillation of the output signal on line 44 is a non-linear function of the reflector voltage $V_T$ on line 20. Therefore, the feedback element 102 must be non-linear in order to compensate for this non-linearity. In particular, in order to compensate for the non-linearity shown in FIG. 7b, a non-linear circuit element 102 should be utilized resulting in a non-linearity between the reflector voltage $V_T$ on line 20 and the voltage on line 48, $T_A$, as shown in FIG. 7c. This would yield a linear output between the voltage on line 48, $T_A$, and the frequency of the output signal on line 44 as illustrated in FIG. 7a.

Turning to FIGS. 4a and 4b, the feedback element 102 is shown as a non-linear element as distinguished from the linear element shown in FIG. 3. The non-linear feedback element provides the necessary compensation for the non-linearity contained in tuning element 120 as demonstrated by FIGS. 7a through 7c. The linear feedback element 102 shown in FIG. 3 consists of a resistive networdk 140. As shown in FIG. 4a, one non-linear feedback element 102 is a diode 152. Diode 152 is typically a logarithmic diode, such as a Schottky diode. Diode 152 produces an approximation of the curve illustrated in FIG. 7c. Non-linear element 102, shown in FIG. 4b, consists of three diodes 154, 156 and 158 and three resistors, 160, 162, and 164. Non-linear element 102 of FIG. 4b illustrates a piecewise linear network which, depending on the values of resistors 160, 162 and 164 as well as the externally applied DC bias voltages (not shown for convenience sake in FIG. 4b), can produce a piecewise linear approximation of the curve of FIG. 7c or any other curve which would adequately compensate for the non-linearity of tuning element 120.

Figure 5B:
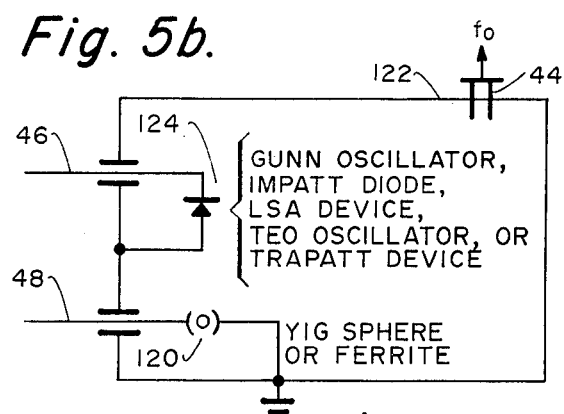

Now turning to FIGS. 5a through 5f, the tuning element 120 and oscillating element 124 contained within cavity 122 are illustrated in more detail. In particular, as shown in FIG. 5a, oscillating element 124 may be a Gunn oscillator, an IMPATT diode, LSA device, a TEO oscillator, or a TRAPATT device while tuning element 120 is shown as a varactor. It is noted that the cavity 122, tuning element 120, and oscillating element 124 are identical to those shown in FIG. 3. In FIG. 5b, cavity 122 is shown containing an oscillating element 124 which can be a Gunn oscillator, an IMPATT diode, an LSA device, a TEO oscillator, or a TRAPATT device while tuning element 120 is shown to be a YIG sphere or ferrite.

Figure 5C:
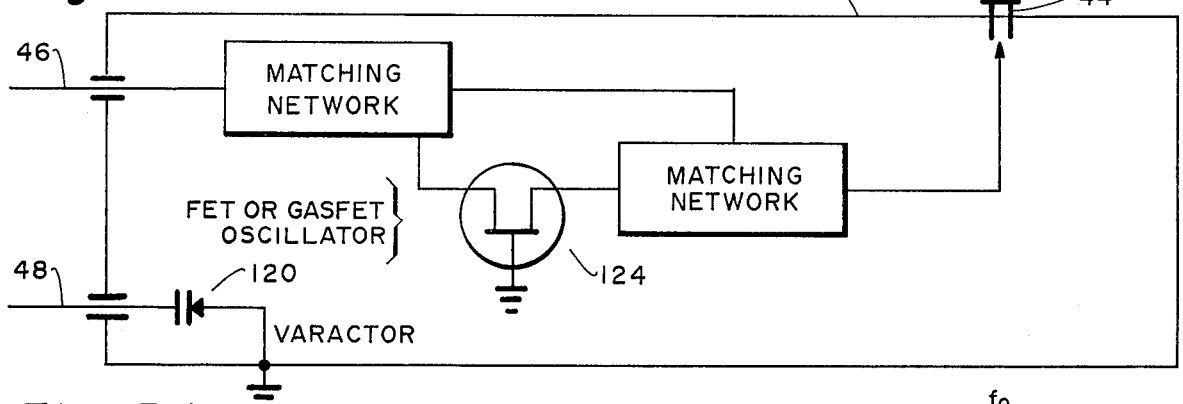

Now turning to FIG. 5c, oscillating element 124 is illustrated as a FET or GASFET oscillator having a pair of matching networks for tuning purposes while tuning element 120 is shown to be a varactor. It is noted that the matching networks shown in FIG. 5c for oscillating element 124 as well as the FET or GASFET transistor associated therewith are off-the-shelf items readily available from any of the major semiconductor producers in this country or abroad.

Figure 5D:
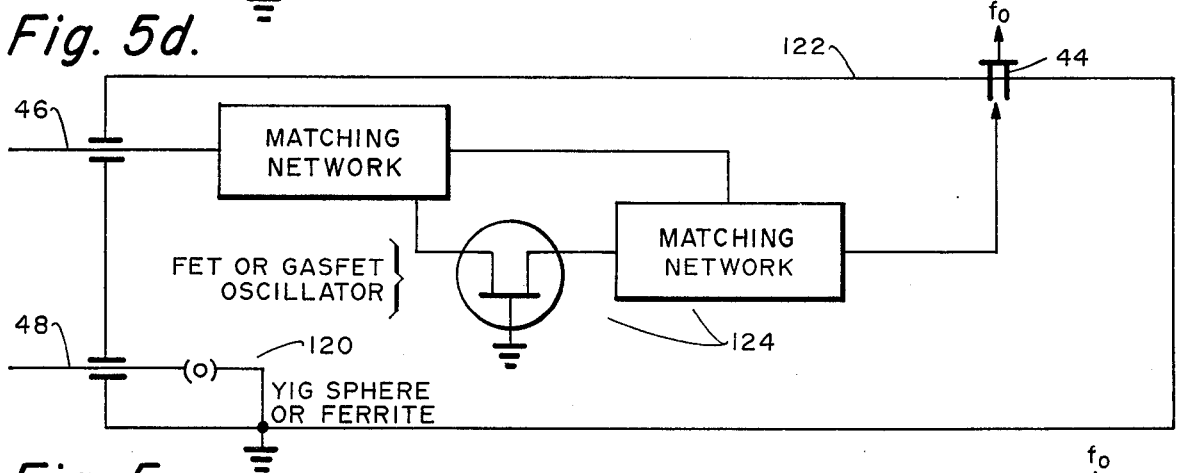

FIG. 5d illustrates oscillating element 124 as a FET or GASFET transistor oscillator while tuning element 120 is shown to be a YIG sphere or ferrite.

Figure 5E:
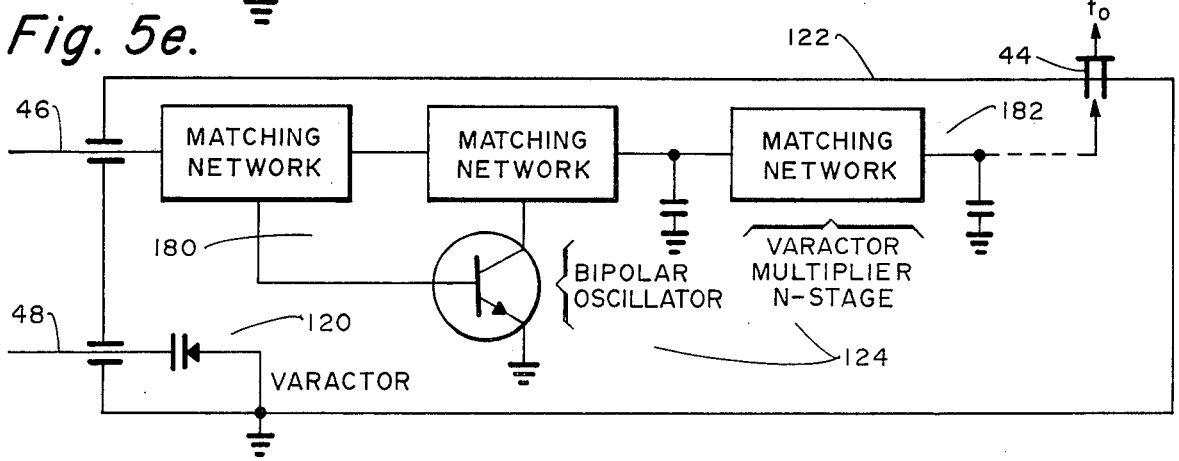
Figure 5F:
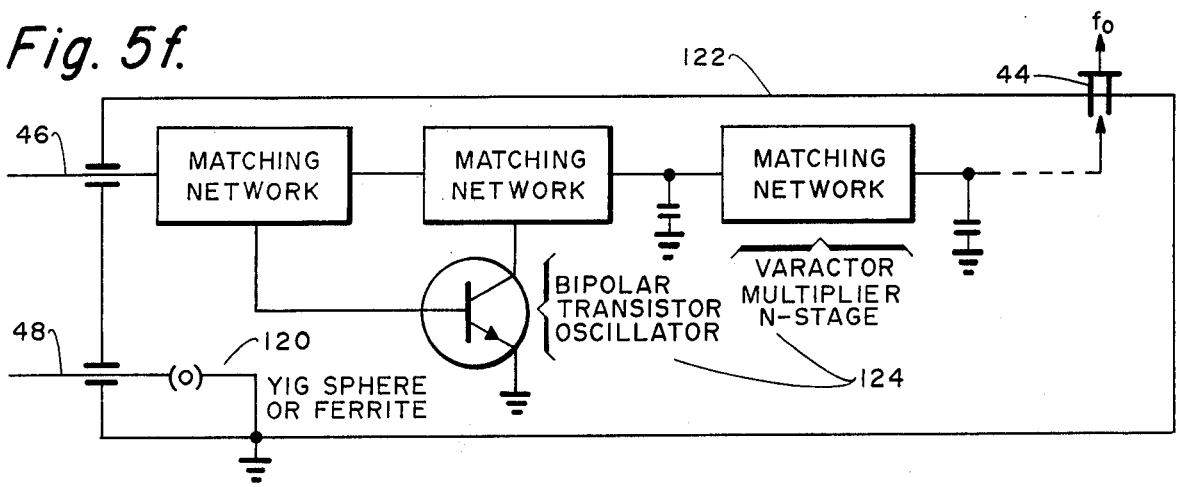

Turning to FIG. 5e, oscillating element 124 is shown to be a bipolar transistor oscillator stage followed by an n-stage varactor multiplier. It is noted that bipolar transistor oscillator 180 and matching networks are commercially available items as well as n-stage varactor multiplier network 182 with its associated matching network. Tuning element 120 in FIG. 5e is shown to be a varactor. FIG. 5f is identical with FIG. 5e as to the oscillating element 124. However, the tuning element 120 is a YIG sphere or ferrite rather than a varactor.

Figure 6:
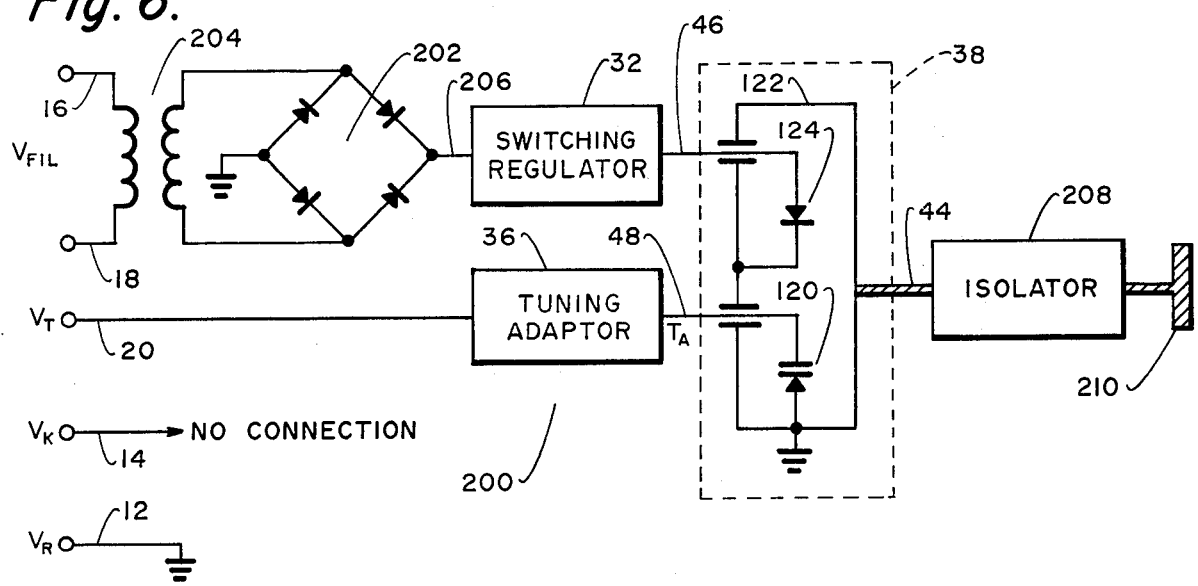
FIG. 6 illustrates another embodiment of the present invention.

Now turning to FIG. 6, an alternative embodiment of the present invention is illustrated. Instead of utilizing the cathode voltage on line 14, as shown in FIG. 2, the embodiment 200 of FIG. 6 utilizes the filament voltage, $V_{FIL}$, on lines 16 and 18 to provide the DC voltage on line 46 to drive the oscillating element 124 of solid state oscillator 38. The AC filament voltage, $V_{FIL}$, is full-wave rectified by full-wave rectifier 202. $V_{FIL}$ is inductively coupled to fullwave rectifier 202 through inductor pair 204. Again, switching regulator circuit 32 converts the high DC voltage level on line 206 from full-wave rectifier 202 to the generally lower voltages required for oscillating element 124 of solid state oscilltor 38 on line 46.

The cathode voltage on line 14 is provided with no connection while as in FIG. 2 the resonator voltage, $V_R$, is grounded. The reflector voltage, $V_T$, as in FIG. 2, is coupled to a tuning adapter 36 which outputs a DC signal, $T_A$, to drive tuning element 120 of solid state oscillator 38. Switching regulator 32, tuning adapter 36, and solid state oscillator 38 are identical in structure and operation as those shown in FIGS. 2, 3, 4a, 4b and 5a–f.

The AC output signal of frequency $f_O$ on line 44 from cavity 122 is coupled through isolator 208 to flange 210. Isolator 208 prevents any of the components attached to the system behind flange 210 from loading solid state oscillator 38.

It will be appreciated by those skilled in the art that the complete circuit diagrams of FIG. 1 – 6 include such suitable and necessary biasing voltage sources as are usually provided in such circuits. All such biasing is not shown in FIGS. 1 – 6.

Obviously numerous modifications and variations of the present invention are possible in light of the above teachings. It is therefore to be understood that within the scope of the appended claims the invention may be practiced otherwise than as specifically described herein.

What is claimed is:

1. A solid state microwave generator for use in place of a low power tube-type klystron and operable from the klystron cathode and reflector voltage supplies comprising:
   a. means for providing a cathode voltage;
   b. means for providing a reflector voltage;
   c. means responsive to said cathode voltage for reducing the voltage level of said cathode voltage to a first predetermined voltage;
   d. tuning adapter means responsive to said reflector voltage for providing gain compensation to said reflector voltage; and
   e. solid state oscillator means responsive to said first predetermined voltage and said gain compensated reflector voltage for generating an a-c output signal, said gain compensated reflector voltage determining the frequency of said a-c output signal.

2. The apparatus of claim 1 wherein said solid state oscillating means includes:
   a. an oscillator cavity;
   b. tuning means disposed inside said oscillator cavity and responsive to said gain compensated reflector voltage for determining the frequency of said a-c output signal;
   c. an oscillator element responsive to said first predetermined voltage and to said tuning means for providing said a-c output signal, said oscillator element being disposed within said cavity.

3. The apparatus of claim 2 wherein said tuning means includes a varactor.

4. The apparatus of claim 2 wherein said tuning means includes a YIG sphere.

5. The apparatus of claim 2 wherein said tuning means includes a ferrite.

6. The apparatus of claim 2 wherein said tuning adapter means provides gain compensation to said reflector voltage such that the frequency of said a-c output signal is a linear function of said reflector voltage.

7. The apparatus of claim 1 wherein said tuning adapter means includes an operational amplifier having a non-linear element in a feedback path.

8. The apparatus of claim 7 wherein said non-linear element includes a logarithmic diode network.

9. The apparatus of claim 7 wherein said non-linear element includes a piecewise linear diode network.

10. The apparatus of claim 2 wherein said oscillator element includes a Gunn oscillator.

11. The apparatus of claim 2 wherein said oscillator element includes an Impatt diode.

12. The apparatus of claim 2 wherein said oscillator element includes an LSA device.

13. The apparatus of claim 2 wherein said oscillator element includes a Trapatt device.

14. The apparatus of claim 2 wherein said oscillator element includes a TEO oscillator.

15. The apparatus of claim 2 wherein said oscillator element includes a FET transistor oscillator.

16. The apparatus of claim 2 wherein said oscillator element includes a GASFET transistor oscillator.

17. The apparatus of claim 2 wherein said oscillator element includes:
   a. a bipolar transistor oscillator connected to receive said first predetermined voltage, said bipolar oscillator having a first a-c signal appearing on an output thereof;
   b. an N-stage varactor frequency multiplier circuit connected to receive said first a-c signal, said a-c output signal appearing on the output of said varactor frequency multiplier circuit.

18. A solid microwave generator for use in place of a low power tube-type klystron and operable from the klystron a-c filament and reflector voltage supplies comprising:
   a. means for providing a-c filament voltage;
   b. fullwave rectifier means for converting said a-c filament voltage to a d-c filament voltage;
   c. means connected to receive said d-c filament voltage for reducing the voltage level of said d-c filament voltage to a first predetermined voltage;
   d. means for providing a reflector voltage;
   e. tuning adapter means responsive to said reflector voltage for providing gain compensation to said reflector voltage; and
   f. solid state oscillator means being connected to receive said first predetermined voltage and said gain compensated reflector voltage for generating an a-c output signal, said gain compensated reflector voltage determining the frequency of said a-c output signal.

19. The apparatus of claim 18 wherein said solid state oscillating means includes:
   a. an oscillator cavity;
   b. tuning means disposed inside said oscillator cavity and responsive to said gain compensated reflector voltage for determining the frequency of said a-c output signal;
   c. an oscillator element responsive to said first predetermined voltage and to said tuning means for providing said a-c output signal, said oscillator element being disposed within said cavity.

20. The apparatus of claim 19 wherein said tuning means includes a varactor.

21. The apparatus of claim 19 wherein said tuning means includes a YIG sphere.

22. The apparatus of claim 19 wherein said tuning means includes a ferrite.

23. The apparatus of claim 19 wherein said tuning adapter means provides gain compensation to said reflector voltage such that the frequency of said a-c output signal is a linear function of said reflector voltage.

24. The apparatus of claim 18 wherein said tuning adapter means includes an operational amplifier having a non-linear element in a feedback path.

25. The apparatus of claim 24 wherein said non-linear element includes a logarithmic diode network.

26. The apparatus of claim 24 wherein said non-linear element includes a piecewise linear diode netowrk.

27. The apparatus of claim 19 wherein said oscillator element includes a Gunn oscillator.

28. The apparatus of claim 19 wherein said oscillator element includes an IMPATT diode.

29. The apparatus of claim 19 wherein said oscillator element includes an LSA device.

30. The apparatus of claim 19 wherein said oscillator element includes a TRAPATT device.

31. The apparatus of claim 19 wherein said oscillator element includes a TEO oscillator.

32. The apparatus of claim 19 wherein said oscillator element includes a FET transistor oscillator.

33. The apparatus of claim 19 wherein said oscillator element includes a GASFET transistor oscillator.

34. The apparatus of claim 19 wherein said oscillator element includes:
a. a bipolar transistor oscillator connected to receive said first predetermined voltage, said bipolar oscillator having a first a-c signal appearing on an output thereof;
b. an N-stage varactor frequency multiplier circuit connected to receive said first a-c signal, said a-c output signal appearing on an output of said varactor frequency multiplier circuit.

* * * * *